(12) United States Patent
Tsutsui et al.

(10) Patent No.: US 11,149,987 B2
(45) Date of Patent: Oct. 19, 2021

(54) SOLAR HEAT COLLECTOR TUBE AND PRODUCTION METHOD THEREOF

(71) Applicants: KABUSHIKI KAISHA TOYOTA JIDOSHOKKI, Kariya (JP); JAPAN FINE CERAMICS CENTER, Nagoya (JP)

(72) Inventors: Takuhito Tsutsui, Kariya (JP); Toru Sasatani, Kariya (JP); Kazuto Noritake, Kariya (JP); Yoshiki Okuhara, Nagoya (JP); Tomohiro Kuroyama, Nagoya (JP); Daisuke Igimi, Nagoya (JP)

(73) Assignees: KABUSHIKI KAISHA TOYOTA JIDOSHOKKI, Kariya (JP); JAPAN FINE CERAMICS CENTER, Nagoya (JP)

( * ) Notice: Subject to any disclaimer, the term of this patent is extended or adjusted under 35 U.S.C. 154(b) by 17 days.

(21) Appl. No.: 16/073,375

(22) PCT Filed: Nov. 18, 2016

(86) PCT No.: PCT/JP2016/084339
§ 371 (c)(1),
(2) Date: Jul. 27, 2018

(87) PCT Pub. No.: WO2017/130534
PCT Pub. Date: Aug. 3, 2017

(65) Prior Publication Data
US 2019/0032966 A1 Jan. 31, 2019

(30) Foreign Application Priority Data
Jan. 29, 2016 (JP) .............................. JP2016-015519

(51) Int. Cl.
*F24S 70/10* (2018.01)
*F24S 10/70* (2018.01)
(Continued)

(52) U.S. Cl.
CPC ................ *F24S 70/10* (2018.05); *B32B 1/08* (2013.01); *C23C 14/06* (2013.01); *C23C 14/165* (2013.01);
(Continued)

(58) Field of Classification Search
USPC ........................................................ 126/676
See application file for complete search history.

(56) References Cited

U.S. PATENT DOCUMENTS 5,523,132 A * 6/1996 Zhang ..................... B32B 17/06
428/34.4
2002/0060866 A1* 5/2002 Ishii ..................... G02B 5/0858
359/883
(Continued)

FOREIGN PATENT DOCUMENTS

CN 101514853 A 8/2009
CN 103105011 A 5/2013
(Continued)

OTHER PUBLICATIONS

Communication dated May 26, 2020, from the China National Intellectual Property Administration in Counterpart Application No. 201680080239.1.
(Continued)

*Primary Examiner* — Kenneth J Hansen
*Assistant Examiner* — John E Bargero
(74) *Attorney, Agent, or Firm* — Sughrue Mion, PLLC

(57) ABSTRACT

A solar heat collector tube in which at least an infrared reflective layer, a sunlight-heat conversion layer and an anti-reflection layer are provided on the outer surface of a
(Continued)

tube, through the interior of which a heat medium can flow, wherein the infrared reflective layer is an Ag layer in which silicon, silicon nitride or a mixture thereof is dispersed, and a method for producing the solar heat collector tube wherein the infrared reflective layer that is an Ag layer, in which silicon, silicon nitride or a mixture thereof is dispersed, is formed by sputtering in the presence of a gas including nitrogen gas, with Ag and silicon being used as targets.

12 Claims, 6 Drawing Sheets

(51) Int. Cl.
- *B32B 1/08* (2006.01)
- *C23C 14/16* (2006.01)
- *C23C 14/06* (2006.01)
- *F24S 70/30* (2018.01)
- *F24S 70/60* (2018.01)
- *F24S 70/20* (2018.01)

(52) U.S. Cl.
CPC .............. *F24S 10/70* (2018.05); *F24S 70/30* (2018.05); *F24S 70/60* (2018.05); *F24S 70/20* (2018.05); *Y02E 10/44* (2013.01)

(56) References Cited

U.S. PATENT DOCUMENTS

| | | | |
|---|---|---|---|
| 2002/0146570 A1* | 10/2002 | Choi | G02B 5/289 428/432 |
| 2006/0141272 A1* | 6/2006 | Wolfe | G02B 5/0891 428/457 |
| 2010/0294263 A1 | 11/2010 | Kuckelkorn et al. | |
| 2011/0005575 A1* | 1/2011 | Cao | H01L 31/02366 136/246 |
| 2011/0088687 A1* | 4/2011 | Kuckelkorn | F24S 20/20 126/677 |
| 2011/0249326 A1* | 10/2011 | Villuendas Yuste | C23C 14/35 359/360 |
| 2014/0305123 A1 | 10/2014 | Sato et al. | |
| 2016/0003498 A1* | 1/2016 | Kusiaku | C23C 28/32 428/216 |

FOREIGN PATENT DOCUMENTS

| | | |
|---|---|---|
| CN | 103443559 A | 12/2013 |
| CN | 104854412 A | 8/2015 |
| CN | 104949362 A | 9/2015 |
| DE | 10 2013 112 532 A1 | 5/2015 |
| EP | 2341038 A1 | 7/2011 |
| EP | 2930446 A1 | 10/2015 |
| JP | 07315874 A | 12/1995 |
| JP | 2010-271033 A | 12/2010 |
| WO | 2014007218 A1 | 1/2014 |
| WO | 2014/087759 A1 | 6/2014 |

OTHER PUBLICATIONS

Communication dated Sep. 15, 2020, from European Patent Office in EP Application No. 16 888 119.1.
Communication dated Jun. 5, 2019, from the European Patent Office in counterpart European Application No. 16888119.1.
H. S. Gurev et al., "High Temperature; Stable, Spectrally Selective Solar Absorbers for Thermochemical Hydrogen Production", International Journal of Hydrogen Energy, Pergamon Press, 1977, vol. 2, pp. 259-267 (9 pages total).
P. Hollingsworth Smith et al., "Silicon Dioxide as a High Temperature Stabilizer for Silver Films", Thin Solid Films, Elsevier Sequoia S.A., Lausanne, 1977, vol. 45, pp. 159-168 (10 pages total).
Communication dated May 31, 2019, from the China National Intellectual Property Administration in Counterpart Application No. 201680080239.1.

* cited by examiner

[Fig.1]
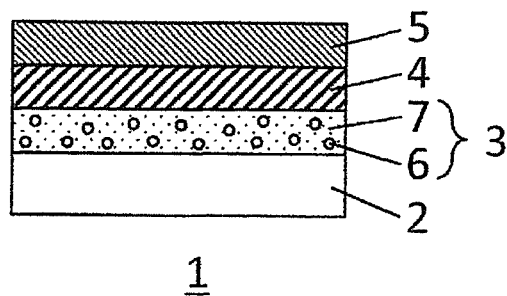
[Fig.2]
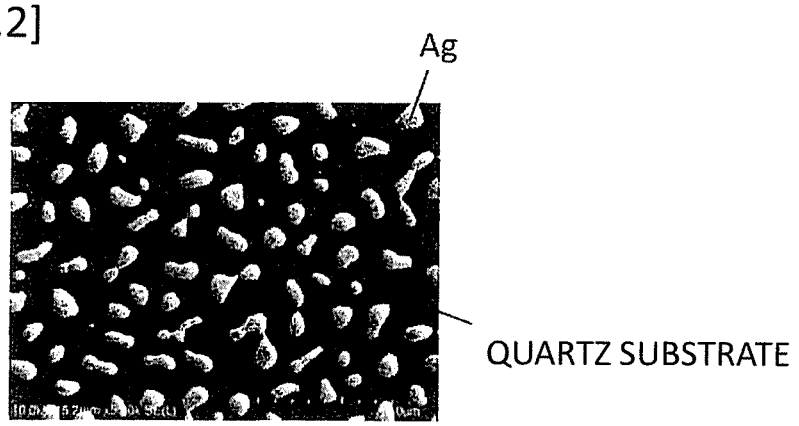
[Fig.3]
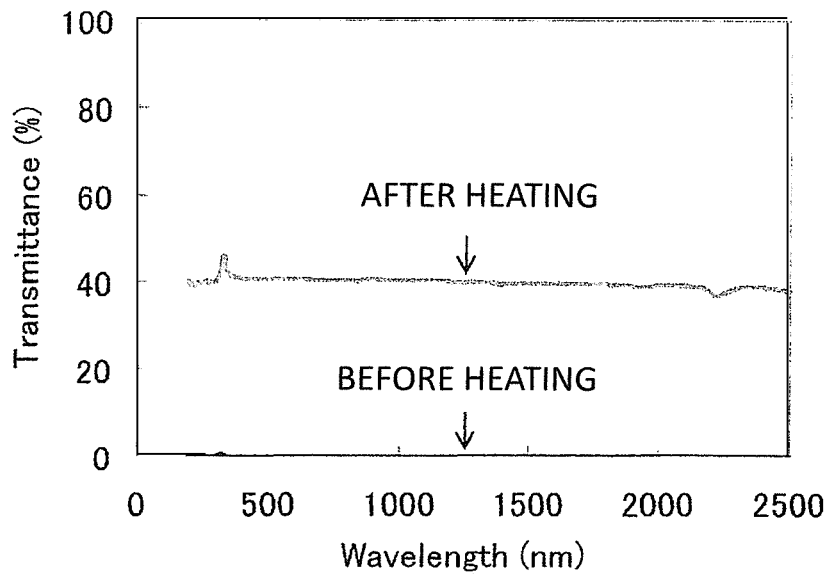

[Fig.4]
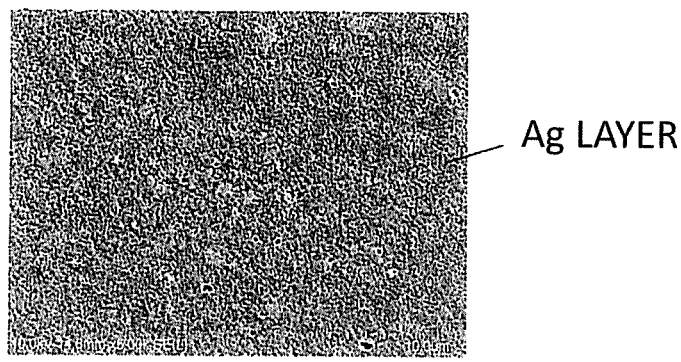
Ag LAYER
[Fig.5]
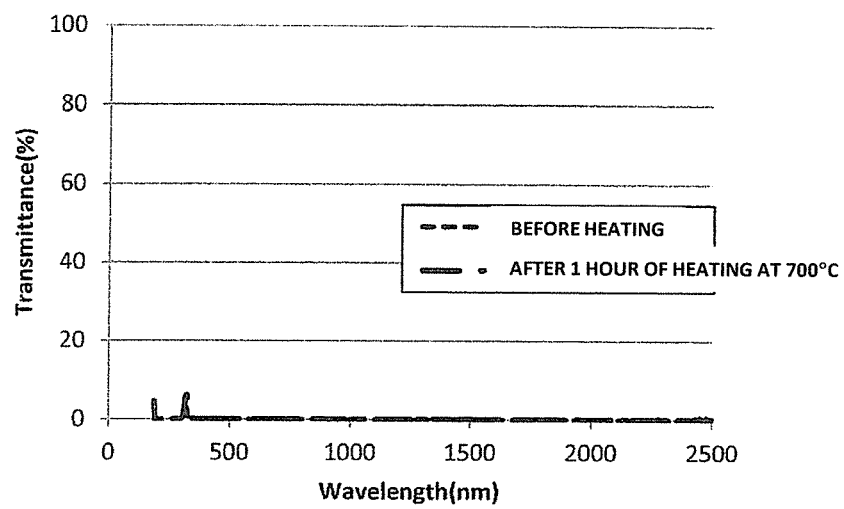
[Fig.6]
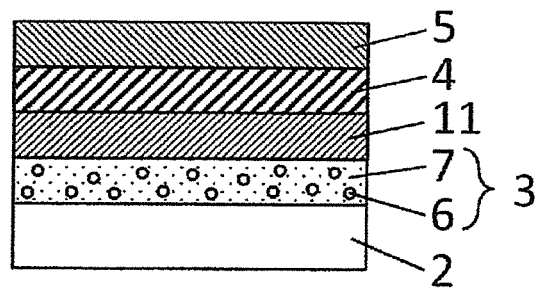

[Fig.7]
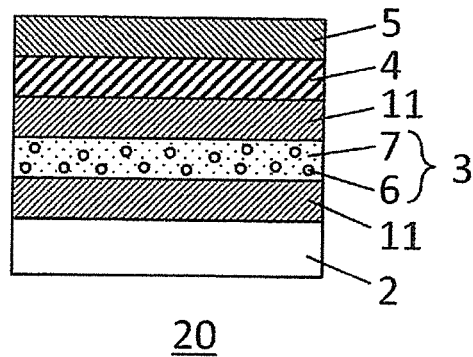
20
[Fig.8]
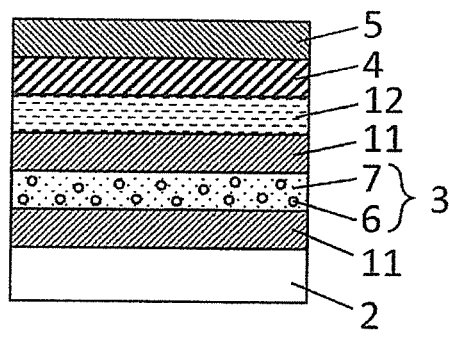
30
[Fig.9]
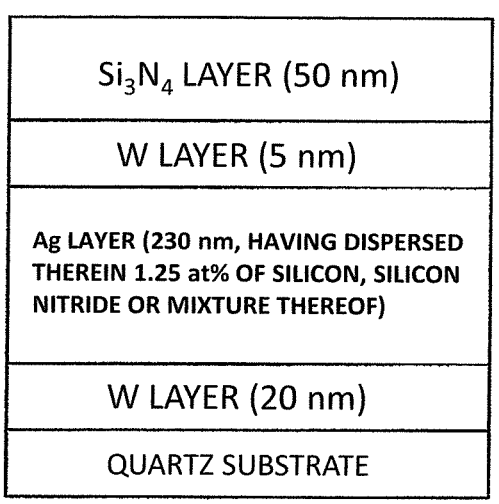

[Fig.10]
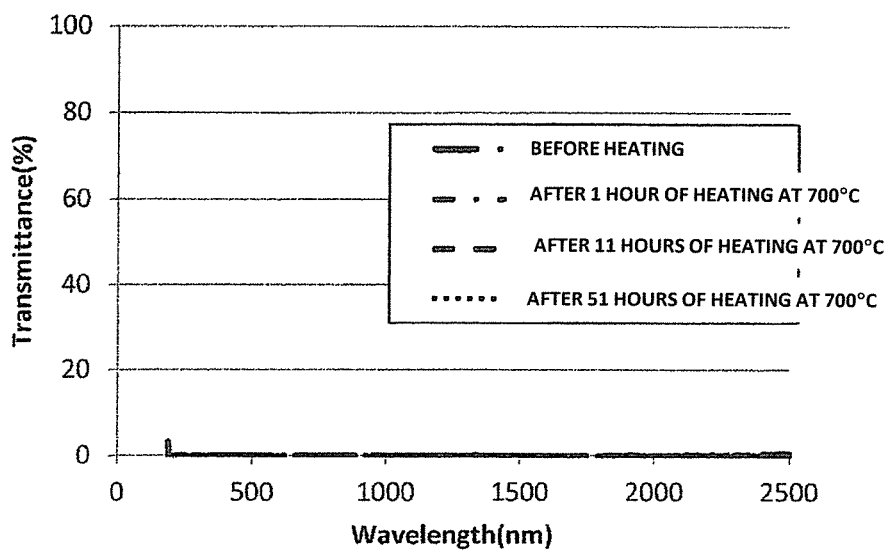
[Fig.11]
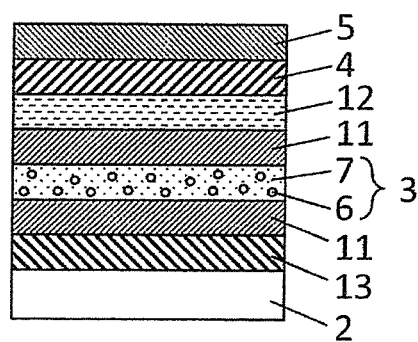

[Fig.12]
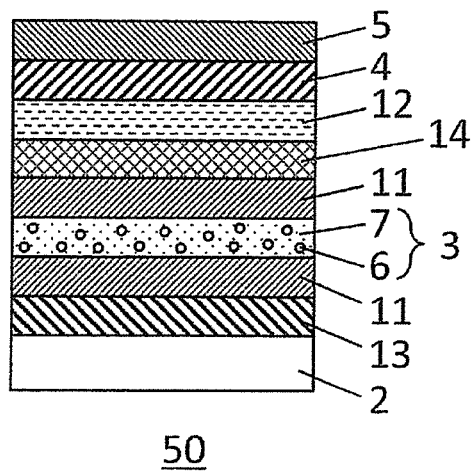
50
[Fig.13]
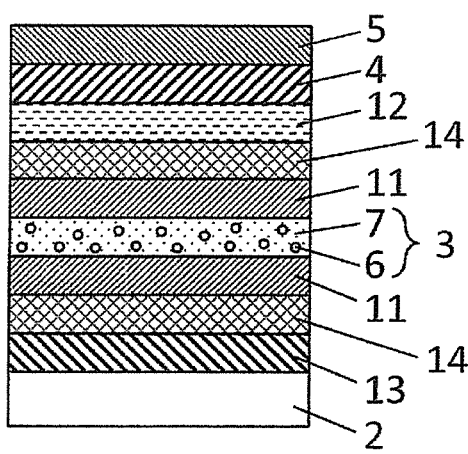
60

[Fig.14]
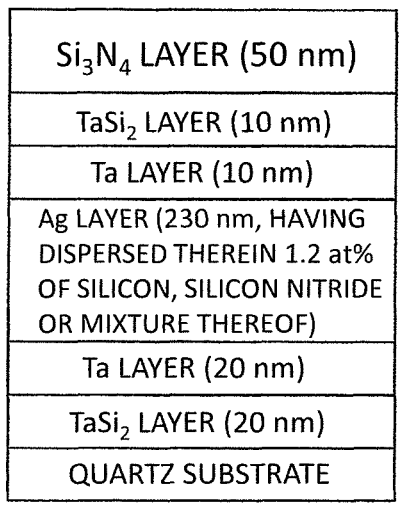
[Fig.15]
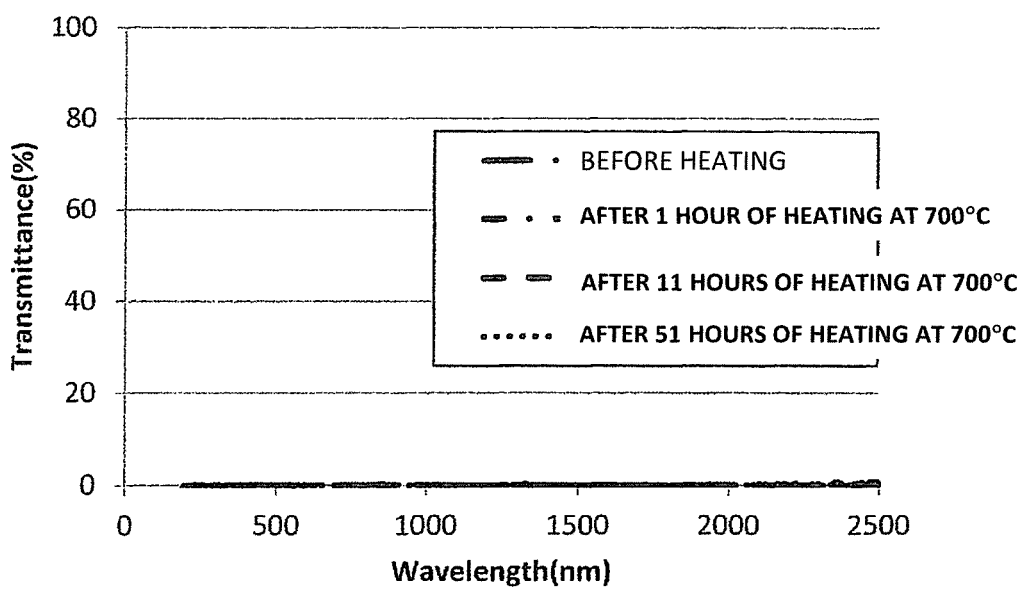

SOLAR HEAT COLLECTOR TUBE AND PRODUCTION METHOD THEREOF

CROSS REFERENCE TO RELATED APPLICATIONS

This Application is a National Stage of International Application No. PCT/JP2016/084339 filed Nov. 18, 2016, claiming priority based on Japanese Patent Application No. 2016-015519 filed Jan. 29, 2016.

TECHNICAL FIELD

The present invention relates to a solar heat collector tube and a production method thereof.

BACKGROUND ART

Solar heat power generation apparatuses that convert sunlight to heat and generate power utilizing that heat are known. In these apparatuses, sunlight is condensed by condensing means, a heat medium inside a solar heat collector tube is heated by the condensed sunlight, and thermal energy of the heat medium having been thus heated is utilized to generate power. Such apparatuses utilize therefore a solar heat collector tube in which various layers for efficiently converting sunlight to heat are formed on the outer surface of a tube, through the interior of which the heat medium can flow. On the outer surface of a tube, through the interior of which a heat medium can flow, there are, for instance, formed an infrared reflective layer that reflects thermal radiation from the medium and the tube, a sunlight-heat conversion layer that converts sunlight to heat, and an anti-reflection layer that prevents reflection of sunlight. Among these various layers, using an Ag layer on the infrared reflective layer, is well known (see for instance Patent Literature 1).

CITATION LIST

Patent Literature

[Patent Literature 1] Japanese Patent Application Publication No. 2010-271033

SUMMARY OF INVENTION

Technical Problem

When the temperature of the heat medium flowing through the interior of the solar heat collector tube increases, the temperature of the outer surface of the tube having the heat medium flowing therethrough becomes around 650° C. to 700° C., and also the infrared reflective layer formed on the outer surface of the tube becomes exposed to a high temperatures. Herein Ag layers conventionally used as the infrared reflective layer do not have sufficient heat resistance, and as a result Ag suffers aggregation and sublimation, in about 1 hour, when exposed to high temperature, and the effect of reflecting thermal radiation from the heat medium and the tube is weakened. Thus the efficiency of converting sunlight to heat decreases, since the Ag layer in such a state cannot sufficiently function as an infrared reflective layer.

In order to solve the above problem, it is an object of the present invention to provide a solar heat collector tube and a production method thereof in which efficiency of conversion of sunlight to heat does not drop readily, through the use, in an infrared reflective layer, of an Ag layer having excellent heat resistance and in which aggregation and sublimation of Ag can be suppressed, even upon exposure to high temperatures.

Solution to Problem

As a result of diligent research aimed at solving the above problem, the inventors found that aggregation and sublimation of Ag can be suppressed by dispersing silicon, silicon nitride or a mixture thereof in the Ag layer, and perfected the present invention on the basis of that finding.

Specifically, the present invention is a solar heat collector tube in which at least an infrared reflective layer, a sunlight-heat conversion layer and an anti-reflection layer are provided on the outer surface of a tube, through the interior of which a heat medium can flow, wherein the infrared reflective layer is an Ag layer in which silicon, silicon nitride or a mixture thereof is dispersed.

Also, the present invention is a method for producing a solar heat collector tube in which at least an infrared reflective layer, a sunlight-heat conversion layer and an anti-reflection layer are provided on the outer surface of a tube, through the interior of which a heat medium can flow, the method including: forming the infrared reflective layer that is an Ag layer in which silicon, silicon nitride or a mixture thereof is dispersed, by sputtering in the presence of a gas including nitrogen gas, with Ag and silicon being used as targets.

Advantageous Effects of Invention

The present invention succeeds in providing a solar heat collector tube and a production method thereof in which efficiency of conversion of sunlight to heat does not drop readily, through the use, in an infrared reflective layer, of an Ag layer having excellent heat resistance and in which aggregation and sublimation of Ag can be suppressed, even upon exposure to high temperatures.

BRIEF DESCRIPTION OF DRAWINGS

FIG. 1 is a partial cross-sectional diagram of a solar heat collector tube of Embodiment 1.

FIG. 2 is a scanning electronic microscope (SEM) micrograph of an Ag layer made of Ag alone and formed on a quartz substrate, after having been heated for 1 hour at 700° C.

FIG. 3 illustrates results of light transmittance of an Ag layer made of Ag alone and formed on a quartz substrate, before and after 1 hour of heating at 700° C.

FIG. 4 illustrates a scanning electronic microscope (SEM) micrograph of an Ag layer formed on a quartz substrate and having silicon, silicon nitride or a mixture thereof dispersed therein, after heating at 700° C. for 1 hour.

FIG. 5 illustrates results of light transmittance of an Ag layer formed on a quartz substrate and having silicon, silicon nitride or a mixture thereof dispersed therein, before and after heating the Ag layer at 700° C. for 1 hour.

FIG. 6 is a partial cross-sectional diagram of a solar heat collector tube of Embodiment 2.

FIG. 7 is a partial cross-sectional diagram of a solar heat collector tube of Embodiment 3.

FIG. 8 is a partial cross-sectional diagram of a solar heat collector tube of Embodiment 4.

FIG. 9 is a stack resulting from sequential layering, on a quartz substrate, of a metal protective layer (20 nm W layer), an Ag layer (230 nm) having dispersed therein 1.25 at % of silicon, silicon nitride or a mixture thereof, a metal protective layer (5 nm W layer) and an oxygen barrier layer (50 nm $Si_3N_4$ layer).

FIG. 10 illustrates results of light transmittance of the stack of FIG. 9 before and after heating of the stack at 700° C. for 1 hour, 11 hours and 51 hours.

FIG. 11 is a partial cross-sectional diagram of a solar heat collector tube of Embodiment 5.

FIG. 12 is a partial cross-sectional diagram of a solar heat collector tube of Embodiment 6.

FIG. 13 is a partial cross-sectional diagram of a solar heat collector tube of Embodiment 7.

FIG. 14 is a stack resulting from sequential layering, on a quartz substrate, of a reaction preventing layer (20 nm $TaSi_2$ layer), a metal protective layer (20 nm Ta layer), an Ag layer (230 nm) having dispersed therein 1.25 at % of silicon, silicon nitride or a mixture thereof, a metal protective layer (10 nm Ta layer), a reaction preventing layer (10 nm $TaSi_2$ layer) and an oxygen barrier layer (50 nm $Si_3N_4$ layer).

FIG. 15 illustrates results of light transmittance of the stack of FIG. 14 before and after heating of the stack at 700° C. for 1 hour, 11 hours and 51 hours.

DESCRIPTION OF EMBODIMENTS

Preferred embodiments of the solar heat collector tube and production method thereof of the present invention will be explained next with reference to accompanying drawings.

Embodiment b 1

FIG. 1 is a partial cross-sectional diagram of a solar heat collector tube of the present embodiment.

In FIG. 1 a solar heat collector tube 1 of the present embodiment has a tube 2, through the interior of which a heat medium can flow, an infrared reflective layer 3 formed on the outer surface of the tube 2, a sunlight-heat conversion layer 4 formed on the infrared reflective layer 3, and an anti-reflection layer 5 formed on the sunlight-heat conversion layer 4.

The tube 2 through the interior of which a heat medium can flow is not particularly limited, and tubes known in the relevant technical field can be used herein. Ordinarily, a metal having heat resistance, as represented by an iron-based material (for instance, stainless steel, heat-resistant steel, alloy steel or carbon steel) or an aluminum-based material, can be used as the material of the tube 2. Taking the usage environment (for instance, the heating temperature of the tube 2) into account, the tube 2 is preferably made of stainless steel or heat-resistant steel.

The heat medium that flows through the interior of the tube 2 is not particularly limited, and heat media known in the relevant technical field can be used herein. Examples of the heat medium include for instance water, oil, molten salts (for instance molten sodium) and the like.

The infrared reflective layer 3 formed on the outer surface of the tube 2 has the function of reflecting thermal radiation (heat radiation) from the heat medium and the tube 2. The heat medium used in the solar heat collector tube 1 and the materials in the tube 2 and so forth may in some instances become heated to a high temperature of around 650° C. to 700° C., in which case most of the emitted electromagnetic waves are infrared rays. Accordingly, the main function of the infrared reflective layer 3 is to reflect these infrared rays. Specifically, the infrared reflective layer 3 suppresses emission, towards the exterior of the tube 2, of thermal energy given off by the heat medium and the tube 2.

Conventionally an Ag layer 7 has been used as the infrared reflective layer 3. However, an Ag layer 7 made up of only Ag exhibits aggregation or sublimation of Ag, after about 1 hour, when exposed at a high temperature of around 650° C. to 700° C.

FIG. 2 illustrates a scanning electronic microscope (SEM) micrograph of an Ag layer 7 made of Ag alone and formed on a quartz substrate, after having been heated for 1 hour at 700° C. FIG. 3 illustrates results of light transmittance of the Ag layer 7 before and after heating.

As depicted in FIG. 2, Ag in the Ag layer 7 sublimates and aggregates due to heating, and the quartz substrate that underlies the lower Ag layer 7 becomes exposed. as illustrated in FIG. 3, the Ag layer 7 before heating has substantially zero light transmittance at a wavelength region from about 200 nm to 2500 nm (no light is transmitted within this wavelength region), whereas the Ag layer 7 after heating exhibits a light transmittance of about 40% in the wavelength region from about 200 nm to 2500 nm (light is transmitted in this wavelength region). The function as the infrared reflective layer 3 (function of reflecting thermal radiation from the heat medium and the tube) is thus not sufficiently brought out by the Ag layer 7 having suffered aggregation and sublimation of Ag, and accordingly the effect in conversion of sunlight to heat is low.

In the solar heat collector tube 1 of the present embodiment, therefore, an Ag layer 7 having dispersed therein silicon, silicon nitride or a mixture thereof 6 is used as the infrared reflective layer 3. Herein the silicon, silicon nitride or a mixture thereof 6 has the function of suppressing aggregation and sublimation of Ag in the Ag layer 7, as a result of which there is enhanced the heat resistance of the Ag layer 7.

FIG. 4 illustrates a scanning electronic microscope (SEM) micrograph of an Ag layer 7 formed on a quartz substrate and having dispersed therein 1.25 at % of silicon, silicon nitride or a mixture thereof 6, after heating at 700° C. for 1 hour. FIG. 5 illustrates results of light transmittance of the Ag layer 7 before and after heating at 700° C. for 1 hour.

As FIG. 4 illustrates, the quartz substrate underlying the Ag layer 7 does not become exposed, and there is virtually no aggregation or sublimation of Ag, even after heating at 700° C. for 1 hour. Moreover, the light transmittance of the Ag layer 7 exhibits virtually no change before or after heating for 1 hour, as illustrated in FIG. 5. Therefore, the Ag layer 7 having dispersed therein the silicon, silicon nitride or a mixture thereof 6 allows suppressing aggregation and sublimation of Ag, even when exposed to a high temperature of about 700° C. Accordingly, the function of the Ag layer 7 as an infrared reflective layer 3 (function of reflecting thermal radiation from the heat medium and the tube) is not impaired, and the efficiency of conversion of sunlight to heat does not drop.

The amount of the silicon, silicon nitride or a mixture thereof 6 dispersed in the Ag layer 7 is not particularly limited, but is preferably lower than 10 at %, and is more preferably 0.1 at % to 5 at %, yet more preferably 0.3 at % to 3 at %, and particularly preferably 0.5 at % to 2 at %.

The thickness of the Ag layer 7 having dispersed therein the silicon, silicon nitride or a mixture thereof 6 is not particularly limited, but is preferably 10 nm to 500 nm, more preferably 30 nm to 400 nm, and yet more preferably 50 nm to 300 nm.

The Ag layer 7 having dispersed therein the silicon, silicon nitride or a mixture thereof 6 can be formed by sputtering in the presence of a gas including argon gas or nitrogen gas, with Ag and silicon being used as targets. The sputtering conditions are not particularly limited, and may be adjusted as appropriate depending on the apparatus that is utilized. As the target, individual targets of Ag and silicon, or one target in the form of a mixture of Ag and silicon can be used.

The Ag layer 7 may have further dispersed therein at least one metal selected from the group consisting of Mo, W, Ta, Nb and Al, in addition to the silicon, silicon nitride or a mixture thereof 6. Similarly to the silicon, silicon nitride or a mixture thereof 6, the at least one metal selected from the group consisting of Mo, W, Ta, Nb and Al elicits the effect of suppressing aggregation and sublimation of Ag in the Ag layer 7, and as a result also enhancing the heat resistance of the Ag layer 7.

In a case where the Ag layer 7 has dispersed therein the silicon, silicon nitride or a mixture thereof 6 and at least one metal selected from the group consisting of Mo, W, Ta, Nb and Al, the amount of the silicon, silicon nitride or a mixture thereof 6 in the Ag layer 7 is not particularly limited, but is preferably lower than 10 at %, and is more preferably 2 at % to 4 at %, while the amount of the at least one metal selected from the group consisting of Mo, W, Ta, Nb and Al in the Ag layer 7 is not particularly limited, but is preferably lower than 10 at %, and is more preferably 7 at % to 9 at %.

The thickness of the Ag layer 7 having dispersed therein the silicon, silicon nitride or a mixture thereof 6 and at least one metal selected from the group consisting of Mo, W, Ta, Nb and Al is not particularly limited, but is preferably 10 nm to 500 nm, and more preferably 50 nm to 300 nm.

The Ag layer 7 having dispersed therein the silicon, silicon nitride or a mixture thereof 6 and the at least one metal selected from the group consisting of Mo, W, Ta, Nb and Al can be formed by sputtering in the presence of a gas including argon gas or nitrogen gas, using Ag, silicon and at least one metal selected from the group consisting of Mo, W, Ta, Nb and Al as targets. The sputtering conditions are not particularly limited, and may be adjusted as appropriate depending on the apparatus that is utilized. The target may be individual targets of Ag, of silicon, and of at least one metal selected from the group consisting of Mo, W, Ta, Nb and Al, or one target in the form of a mixture of Ag, silicon and at least one metal selected from the group consisting of Mo, W, Ta, Nb and Al.

The sunlight-heat conversion layer 4 formed on the infrared reflective layer 3 has the function of efficiently absorbing sunlight while suppressing heat dissipation by thermal radiation. The sunlight-heat conversion layer 4 is also referred to as a light-selective absorption layer.

A sunlight-heat conversion layer known in the relevant technical field can be used, without particular limitations, as the sunlight-heat conversion layer 4. Examples of the sunlight-heat conversion layer 4 include, for instance, a black chromium plating layer, a black nickel plating layer, an electroless nickel blackened layer, a triiron tetraoxide (Oxide black) layer, a cermet layer (layer made up of a composite material of a ceramic and a metal), an iron silicide layer, a manganese silicide layer, a chromium silicide layer, or a layer made up of a composite material of manganese silicide or chromium silicide and a transparent dielectric (for instance, $SiO_2$, $Al_2O_3$, AlN or the like). The foregoing layers may be single layers or a plurality of layers of two or more types.

The thickness of the sunlight-heat conversion layer 4 is not particularly limited, but is preferably 1 nm to 10 and more preferably 5 nm to 100 nm.

The method for forming the sunlight-heat conversion layer 4 is not particularly limited, and a method known in the relevant technical field can be resorted to. For instance, the sunlight-heat conversion layer 4 can be formed by chemical vapor deposition, physical vapor deposition (sputtering, vacuum deposition, ion plating or the like), or by plating.

The anti-reflection layer 5 formed on the sunlight-heat conversion layer 4 has the function of reflecting sunlight.

An anti-reflection layer known in the relevant technical field can be used, without particular limitations, as the anti-reflection layer 5. Examples of the anti-reflection layer 5 include, for instance, transparent dielectric layers such as such as $SiO_2$ layers, $Al_2O_3$ layers, AlN layers, $Cr_2O_3$ layers and the like.

The thickness of the anti-reflection layer 5 is not particularly limited, but is preferably 10 nm to 500 nm.

The method for forming the anti-reflection layer 5 is not particularly limited, and a method known in the relevant technical field can be resorted to. For instance, the anti-reflection layer 5 can be formed by chemical vapor deposition or physical vapor deposition (sputtering, vacuum deposition or ion plating).

Through dispersion of the silicon, silicon nitride or a mixture thereof 6 in the Ag layer 7, the solar heat collector tube 1 of the present embodiment having such features is thereby provided with an infrared reflective layer 3 that suppresses aggregation and sublimation of Ag, and accordingly drops in the efficiency of conversion of sunlight to heat become less likely.

Embodiment 2

FIG. 6 is a partial cross-sectional diagram of a solar heat collector tube of the present embodiment.

In FIG. 6, a solar heat collector tube 10 of the present embodiment differs from the solar heat collector tube 1 of Embodiment 1 in that a metal protective layer 11 is provided between the infrared reflective layer 3 and the sunlight-heat conversion layer 4. Other features are identical to those of the solar heat collector tube 1 of Embodiment 1, and accordingly will not be explained.

The metal protective layer 11 has the function of making Ag contained in the infrared reflective layer 3 less likely to sublimate. Accordingly, sublimation of Ag contained in the infrared reflective layer 3 can be further suppressed, and impairment of the function of the infrared reflective layer 3 made less likely, by formation of the metal protective layer 11 between the infrared reflective layer 3 and the sunlight-heat conversion layer 4.

The metal protective layer used in the metal protective layer 11 is not particularly limited so long as the layer has the function of making Ag less likely to sublimate, and generally the layer is a metal protective layer formed out of a material of a higher melting point than that of Ag (melting point 9618° C.)

Examples of materials having a melting point higher than that of Ag include, for instance, Nb (melting point 2469° C.), Mo (melting point 2623° C.), W (melting point 3422° C.), Cu (melting point 1085° C.), Ni (melting point 1455° C.), Fe (melting point 1538° C.), Cr (melting point 1907° C.), Ta (melting point 3020° C.) and the like.

In a case where at least one metal selected from the group consisting of Mo, W, Ta, Nb and Al is dispersed in the Ag layer 7, the metal protective layer 11 is preferably formed out of a material that contains the metal dispersed in the Ag layer 7 (i.e. at least one metal selected from the group consisting of Mo, W, Ta, Nb and Al). A compound of silicon or nitrogen and at least one metal selected from the group consisting of Mo, W, Ta, Nb and Al can be used as such a material. Examples of such compounds include, for instance, $TaSi_2$ (melting point 2200° C.), $MoSi_2$ (melting point 2020° C.) $Mo_5Si_3$ (melting point 2180° C.), $WSi_2$ (melting point 2160° C.), TaN (melting point 3083° C.), $NbSi_2$ (melting point 1930° C.), NbN (melting point 2300° C.) and the like.

Preferably, the material that forms the metal protective layer 11 has high reflectance towards light in the infrared region. For instance, Nb has a reflectance of 96.1%, Mo of 97.1%, W of 95.2%, Cu of 97.4%, Ni of 86.4%, Fe of 81.8%, Cr of 81.3%, and Ta of 97.3%, towards infrared light at a wavelength of 2500 nm; preferred herein are thus Ta, Nb, Mo, W and Cu having a reflectance towards light in the infrared region in excess of 90%.

The thickness of the metal protective layer 11 may be set as appropriate for instance depending on the type of material that is used and is not particularly limited, but is preferably smaller than the thickness of the infrared reflective layer 3, from the viewpoint of suppressing thermal radiation.

An appropriate thickness of the metal protective layer 11 formed on the infrared reflective layer 3 may be worked out by calculating emissivity on the basis of the results of a multilayer film approximation using the optical constants of the materials that are utilized in the infrared reflective layer 3 and the metal protective layer 11. In a case, for instance, where the metal protective layer 11 is formed using Mo on the infrared reflective layer 3 having a thickness of 100 nm and comprising 1.25 at % of silicon, silicon nitride or a mixture thereof 6, emissivity at 650° C. can be made lower than that of a Cu layer by prescribing the thickness of the metal protective layer 11 (Mo layer) to lie in the range of 0.1 nm to 39.5 nm. In a case where the metal protective layer 11 is formed using W, emissivity at 650° C. can be made lower than that of a Cu layer by prescribing the thickness of the metal protective layer 11 (W layer) to lie in the range of 0.1 nm to 14.1 nm. In a case where the metal protective layer 11 is formed using Nb, emissivity at 650° C. can be made lower than that of a Cu layer by prescribing the thickness of the metal protective layer 11 (Nb layer) to lie in the range of 0.1 nm to 5.6 nm.

The method for forming the metal protective layer 11 is not particularly limited, and a method known in the relevant technical field can be resorted to. For instance, the metal protective layer 11 can be formed by chemical vapor deposition or physical vapor deposition (sputtering, vacuum deposition or ion plating).

A solar heat collector tube 10 of the present embodiment having such features allows yet further suppression of sublimation of Ag contained in the infrared reflective layer 3, and accordingly impairment of the function of the infrared reflective layer 3 becomes yet less likely. Therefore, drops in efficiency of conversion of sunlight to heat are yet less likely in the solar heat collector tube 10.

Embodiment 3

FIG. 7 is a partial cross-sectional diagram of a solar heat collector tube of the present embodiment.

In FIG. 7 a solar heat collector tube 20 of the present embodiment differs from the solar heat collector tube 10 of Embodiment 2 in that a metal protective layer 11 is further provided between the tube 2 and the infrared reflective layer 3. Other features are identical to those of the solar heat collector tube 10 of Embodiment 2, and accordingly will not be explained. The features of the present embodiment can apply also to the solar heat collector tube 1 of Embodiment 1.

The metal protective layer 11 provided between the tube 2 and the infrared reflective layer 3 is provided as the underlying base of the infrared reflective layer 3, and has the function of facilitating uniform formation of the infrared reflective layer 3. Accordingly, the infrared reflective layer 3 can be formed uniformly, and the function of the infrared reflective layer 3 can be obtained stably, by formation of the metal protective layer 11 between the tube 2 and the infrared reflective layer 3.

The metal protective layer 11 that is provided between the tube 2 and the infrared reflective layer 3 is not particularly limited, and there can be used the same metal protective layer 11 that is provided on the infrared reflective layer 3.

The thickness of the metal protective layer 11 provided between the tube 2 and the infrared reflective layer 3 is not particularly limited, so long as the function of the metal protective layer 11 as an underlying base can be brought out, but is generally 1 nm to 100 nm, preferably 3 nm to 50 nm, and more preferably 5 nm to 30 nm.

In addition to the effect of the solar heat collector tube 1 of Embodiment 1 or the solar heat collector tube 10 of Embodiment 2, the solar heat collector tube 20 of the present embodiment having such features allows the function of the infrared reflective layer 3 to be achieved.

Embodiment 4

FIG. 8 is a partial cross-sectional diagram of a solar heat collector tube of the present embodiment.

In FIG. 8, a solar heat collector tube 30 of the present embodiment differs from the solar heat collector tube 20 of Embodiment 3 in that an oxygen barrier layer 12 is provided between the metal protective layer 11 and the sunlight-heat conversion layer 4. Other features are identical to those of the solar heat collector tube 20 of Embodiment 3, and accordingly will not be explained. The features of the present embodiment can apply also to the solar heat collector tube 10 of Embodiment 2.

The oxygen barrier layer 12 is provided for the purpose of preventing passage of oxygen, which gives rise to oxidation of the metal protective layer 11. Accordingly, oxidation of the metal protective layer 11 can be prevented by formation of the oxygen barrier layer 12 between the metal protective layer 11 and the sunlight-heat conversion layer 4, and accordingly impairment of the function of the metal protective layer 11 becomes less likely.

The oxygen barrier layer 12 is not particularly limited and any oxygen barrier layer can be employed so long as the passage of oxygen thereof is not easy, and, for instance, a dielectric layer can be used as the oxygen barrier layer 12. Examples of dielectric layers include, for instance, $SiO_2$ layers, $Al_2O_3$ layers, AlN layers, $Cr_2O_3$ layers and $Si_3N_4$ layers.

The thickness of the oxygen barrier layer 12 is not particularly limited, so long as passage of oxygen is precluded, but is generally 1 nm to 100 nm, preferably 3 nm to 50 nm, and more preferably 5 nm to 30 nm.

The method for forming the oxygen barrier layer 12 is not particularly limited, and a method known in the relevant technical field can be resorted to. For instance, the oxygen barrier layer 12 can be formed by chemical vapor deposition or physical vapor deposition (sputtering, vacuum deposition or ion plating).

Here, the stack in FIG. 9 is produced through sequential layering, on a quartz substrate, of the metal protective layer 11 (20 nm W layer), the Ag layer 7 (230 nm) having dispersed therein 1.25 at % of silicon, silicon nitride or a mixture thereof 6, the metal protective layer 11 (5 nm W layer) and the oxygen barrier layer 12 (50 nm $Si_3N_4$ layer). FIG. 10 illustrates the results of light transmittance of the stack before and after heating of the stack at 700° C. for 1 hour, 11 hours and 51 hours. As FIG. 10 reveals, the light transmittance of the stack exhibits virtually no change before or after heating. By adopting such a multilayer structure, therefore, the functions of the various layers are not impaired and the efficiency of conversion of sunlight to heat does not drop.

In addition to the effect of the solar heat collector tube 10 of Embodiment 2 and the effect of the solar heat collector tube 20 of Embodiment 3, the solar heat collector tube 30 of the present embodiment having such features allows prevention of impairment in the function of the metal protective layer 11 caused by oxidation thereof.

Embodiment 5

FIG. 11 is a partial cross-sectional diagram of solar heat collector tube of the present embodiment.

In FIG. 11, a solar heat collector tube 40 of the present embodiment differs from the solar heat collector tube 30 of Embodiment 4 in that herein a diffusion preventing layer 13 is provided between the tube 2 and the infrared reflective layer 3. Other features are identical to those of the solar heat collector tube 30 of Embodiment 4, and accordingly will not be explained. The features of the present embodiment can also apply to the solar heat collector tube 1 of Embodiment 1, the solar heat collector tube 10 of Embodiment 2 and the solar heat collector tube 20 of Embodiment 3.

The diffusion preventing layer 13 is provided for the purpose of preventing components of the tube 2 (for instance, Cr) from diffusing into the layer (metal protective layer 11 in FIG. 11) overlying the tube 2. Impairment of the function of the layer (metal protective layer 11 in FIG. 11) overlying the tube 2 becomes less likely by formation of the diffusion preventing layer 13 on the outer surface of the tube 2.

A diffusion preventing layer known in the relevant technical field can be used, without particular limitations, as the diffusion preventing layer 13. Examples of materials used in the diffusion preventing layer 13 include, for instance, oxides such as $SiO_2$ and $Al_2O_3$, and nitrides such as $Si_3N_4$ and AlN.

The thickness of the diffusion preventing layer 13 is not particularly limited, so long as components in the tube 2 can be prevented from diffusing into the layer above, but is generally of 1 nm to 100 nm, preferably 3 nm to 50 nm, and more preferably 5 nm to 30 nm.

The method for forming the diffusion preventing layer 13 is not particularly limited, and a method known in the relevant technical field can be resorted to. For instance, the diffusion preventing layer 13 can be formed by chemical vapor deposition or physical vapor deposition (sputtering, vacuum deposition or ion plating).

In addition to the effects of the solar heat collector tube 1 of Embodiment 1, the solar heat collector tube 10 of Embodiment 2, the solar heat collector tube 20 of Embodiment 3 and the solar heat collector tube 30 of Embodiment 4, the solar heat collector tube 40 of the present embodiment having such features allows prevention of impairment in the function of the layer overlying the tube 2.

Embodiment 6

FIG. 12 is a partial cross-sectional diagram of solar heat collector tube of the present embodiment.

In FIG. 12, a solar heat collector tube 50 of the present embodiment differs from the solar heat collector tube 40 of Embodiment 5 in that a reaction preventing layer 14 is provided between the metal protective layer 11 and the oxygen barrier layer 12. Other features are identical to those of the solar heat collector tube 40 of Embodiment 5, and accordingly will not be explained. The features of the present embodiment can also apply to the solar heat collector tube 30 of Embodiment 4.

In a case where the metal protective layer 11 is formed of a metal such as Nb, Mo, W, Cu, Ni, Fe, Cr, Ta or the like, the metal protective layer 11 may react with the oxygen barrier layer 12. The reaction preventing layer 14 is provided in order to prevent such reactions between the metal protective layer 11 and the oxygen barrier layer 12. Impairment of the functions of the metal protective layer 11 and of the oxygen barrier layer 12 becomes accordingly less likely by providing the reaction preventing layer 14 between the metal protective layer 11 and the oxygen barrier layer 12.

Even if the oxygen barrier layer 12 is not formed, the reaction preventing layer 14 allows prevention of reactions between the metal protective layer 11 and the sunlight-heat conversion layer 4. The reaction preventing layer 14 also has the function of preventing passage of oxygen, and accordingly can substitute for the oxygen barrier layer 12 in this case.

The reaction preventing layer 14 is not particularly limited, so long as reactions between the metal protective layer 11 and the oxygen barrier layer 12 or the sunlight-heat conversion layer 4 are less likely, and a layer known in the relevant technical field can be used as the reaction preventing layer 14. Examples of materials utilized in the reaction preventing layer 14 include, for instance, silicides such as niobium silicide ($NbSi_2$) and tantalum silicide ($TaSi_2$). Among the foregoing, the material of the reaction preventing layer 14 is preferably a silicide of a metal that is used in the metal protective layer 11.

The thickness of the reaction preventing layer 14 is not particularly limited so long as reactions between the metal protective layer 11 and the oxygen barrier layer 12 or the sunlight-heat conversion layer 4 can be prevented, but is generally 1 nm to 200 nm, preferably 3 nm to 100 nm and more preferably 5 nm to 80 nm.

The method for forming the reaction preventing layer 14 is not particularly limited, and a method known in the relevant technical field can be resorted to. For instance, the reaction preventing layer 14 can be formed by chemical vapor deposition or physical vapor deposition (sputtering, vacuum deposition or ion plating).

In addition to the effect of the solar heat collector tube 30 of Embodiment 4 and the solar heat collector tube 40 of Embodiment 5, the solar heat collector tube 50 of the present embodiment having such features allows prevention of impairment of the function of the metal protective layer 11 and the oxygen barrier layer 12 or the sunlight-heat conversion layer 4.

In a case where the metal protective layer 11 is formed of a compound of the metal (at least one metal selected from the group consisting of Mo, W, Ta, Nb and Al) dispersed in the Ag layer 7 and silicon or nitrogen (for instance, TaSi$_2$, MoSi$_2$, Mo$_5$Si$_3$, WSi$_2$, TaN, NbSi$_2$ or NbN), the metal protective layer 11 and the oxygen barrier layer 12 do not react readily, and accordingly it is not necessary to provide the reaction preventing layer 14 between the metal protective layer 11 and the oxygen barrier layer 12. Therefore, in a case where the metal protective layer 11 is formed from a compound of the metal dispersed in the Ag layer 7 and silicon or nitrogen, an effect identical to that of the solar heat collector tube 50 of the present embodiment can be achieved, even if the reaction preventing layer 14 is not provided, and also productivity can be increased since it is not necessary to provide the reaction preventing layer 14.

Embodiment 7

FIG. 13 is a partial cross-sectional diagram of a solar heat collector tube of the present embodiment.

In FIG. 13, a solar heat collector tube 60 of the present embodiment differs from the solar heat collector tube 50 of Embodiment 6 in that a reaction preventing layer 14 is provided between the diffusion preventing layer 13 and the metal protective layer 11. Other features are identical to those of the solar heat collector tube 50 of Embodiment 6, and accordingly will not be explained. The features of the present embodiment can apply also to the solar heat collector tube 40 of Embodiment 5.

In a case where the metal protective layer 11 is formed of a metal such as Nb, Mo, W, Cu, Ni, Fe, Cr, Ta or the like, the metal protective layer 11 may react with diffusion preventing layer 13. The reaction preventing layer 14 that is provided between the diffusion preventing layer 13 and the metal protective layer 11 is provided in order to prevent such reactions between the diffusion preventing layer 13 and the metal protective layer 11. Accordingly, impairment of the functions of the diffusion preventing layer 13 and the metal protective layer 11 becomes less likely by providing the reaction preventing layer 14 between the diffusion preventing layer 13 and the metal protective layer 11.

A reaction preventing layer identical to the reaction preventing layer 14 that is provided between the metal protective layer 11 and the oxygen barrier layer 12 can be used as the reaction preventing layer 14 that is provided between the diffusion preventing layer 13 and the metal protective layer 11. Among the foregoing, the material of the reaction preventing layer 14 is preferably a silicide of a metal that is used in the metal protective layer 11.

The thickness of the reaction preventing layer 14 that is provided between the diffusion preventing layer 13 and the metal protective layer 11 is not particularly limited, so long as reactions between the diffusion preventing layer 13 and the metal protective layer 11 can be prevented, but is generally 1 nm to 150 nm, preferably 5 nm to 100 nm and more preferably 10 nm to 80 nm.

Here, the stack in FIG. 14 is produced through sequential layering, on a quartz substrate, of the reaction preventing layer 14 (20 nm TaSi$_2$ layer), the metal protective layer 11 (20 nm Ta layer), the Ag layer 7 (230 nm) having dispersed therein 1.25 at % of silicon, silicon nitride or a mixture thereof 6, the metal protective layer 11 (10 nm Ta layer), the reaction preventing layer 14 (10 nm TaSi$_2$ layer) and the oxygen barrier layer 12 (50 nm Si$_3$N$_4$ layer). FIG. 15 illustrates the results of light transmittance of the stack before and after heating of the stack at 700° C. for 1 hour, 11 hours and 51 hours. As FIG. 15 reveals, the light transmittance of the stack exhibits virtually no change before or after heating. By adopting such a multilayer structure, therefore, the functions of the various layers are not impaired and the efficiency of conversion of sunlight to heat does not drop.

In addition to the effect of the solar heat collector tube 40 of Embodiment 5 and of the solar heat collector tube 50 of Embodiment 6, the solar heat collector tube 60 of the present embodiment having such features allows prevention of impairment of the functions of the metal protective layer 11 and the diffusion preventing layer 13.

In a case where the metal protective layer 11 is formed of a compound of the metal (at least one metal selected from the group consisting of Mo, W, Ta, Nb and Al) dispersed in the Ag layer 7 and silicon or nitrogen (for instance, TaSi$_2$, MoSi$_2$, Mo$_5$Si$_3$, WSi$_2$, TaN, NbSi$_2$ or NbN), the diffusion preventing layer 13 and the metal protective layer 11 do not react readily, and accordingly it is not necessary to provide the reaction preventing layer 14 between the diffusion preventing layer 13 and the metal protective layer 11. Therefore, in a case where the metal protective layer 11 is formed from a compound of the metal dispersed in the Ag layer 7 and silicon or nitrogen, an effect identical to that of the solar heat collector tube 60 of the present embodiment can be achieved, even if the reaction preventing layer 14 is not provided, and also productivity can be increased since it is not necessary to provide the reaction preventing layer 14.

The present international application claims priority based on Japanese Patent Application No. 2016-015519, filed on Jan. 29, 2016, the entire contents whereof being incorporated herein by reference.

REFERENCE SIGNS LIST 1, 10, 20, 30, 40 Solar heat collector tube
2 Tube
3 Infrared reflective layer
4 Sunlight-heat conversion layer
5 Anti-reflection layer
6 Silicon, silicon nitride or a mixture thereof
7 Ag layer
11 Metal protective layer
12 Oxygen barrier layer
13 Diffusion preventing layer
14 Reaction preventing layer

The invention claimed is:

1. A solar heat collector tube in which at least an infrared reflective layer, a sunlight-heat conversion layer and an anti-reflection layer are provided on the outer surface of a tube, through the interior of which a heat medium can flow,
wherein the infrared reflective layer is an Ag layer in which silicon, silicon nitride, or a mixture thereof is dispersed,
wherein a metal protective layer is provided between the infrared reflective layer and the sunlight-heat conversion layer,
wherein the metal protective layer is formed by at least one metal selected from the group consisting of Mo, W, Ta, and Nb, or the metal protective is layer is formed by a compound of silicon or nitrogen with at least one metal selected from the group consisting of Mo, W, Ta, and Nb,
wherein a content of the silicon, the silicon nitride, or the mixture thereof in the infrared reflective layer is from 0.1 to lower than 10 at %, and
wherein at least one metal selected from the group consisting of Mo, W, Ta, Nb, and Al is further dispersed in the Ag layer.

2. The solar heat collector tube of claim 1, wherein another metal protective layer is provided between the tube and the infrared reflective layer.

3. The solar heat collector tube of claim 1, wherein the metal protective layer is formed of a material containing the metal that is dispersed in the Ag layer.

4. The solar heat collector tube of claim 1, wherein the metal protective layer is formed of a compound of silicon or nitrogen, and the metal dispersed in the Ag layer.

5. The solar heat collector tube of claim 1, wherein an oxygen barrier layer is provided between the metal protective layer and the sunlight-heat conversion layer.

6. The solar heat collector tube of claim 1, wherein a diffusion preventing layer is provided between the tube and the infrared reflective layer.

7. The solar heat collector tube of claim 5, wherein a reaction preventing layer is provided between the metal protective layer and the oxygen barrier layer or the sunlight-heat conversion layer.

8. The solar heat collector tube of claim 6, wherein a reaction preventing layer is provided between the diffusion preventing layer and the metal protective layer.

9. A method for producing a solar heat collector tube in which at least an infrared reflective layer, a metal protective layer, a sunlight-heat conversion layer and an anti-reflection layer are provided on the outer surface of a tube, through the interior of which a heat medium can flow, the method comprising:

forming the infrared reflective layer that is an Ag layer in which silicon, silicon nitride or a mixture thereof is dispersed, by sputtering in the presence of a gas including nitrogen gas, with Ag and silicon being used as targets, wherein the metal protective layer is formed by at least one metal selected from the group consisting of Mo, W, Ta, and Nb, or the metal protective layer is formed of a compound of silicon or nitrogen with at least one metal selected from the group consisting of Mo, W, Ta, and Nb, wherein a content of the silicon, the silicon nitride, or the mixture thereof in the infrared reflective layer is from 0.1 to lower than 10 at %, and wherein at least one metal selected from the group consisting of Mo, W, Ta, Nb, and Al is further dispersed in the Ag layer.

10. The solar heat collector tube of claim 5, wherein a reaction preventing layer is provided between the metal protective layer and the oxygen barrier layer.

11. The heat solar heat collector tube of claim 1, wherein a content of the silicon, the silicon nitride or the mixture thereof in the infrared reflective layer is from 0.1 to 5 at %.

12. The method of claim 9, wherein a content of the silicon, the silicon nitride or the mixture thereof in the infrared reflective layer is from 0.1 to 5 at %.

* * * * *